(12) United States Patent
Lam et al.

(10) Patent No.: US 9,997,703 B2
(45) Date of Patent: Jun. 12, 2018

(54) RESISTIVE MEMORY DEVICE HAVING FIELD ENHANCED FEATURES

(71) Applicant: Hewlett-Packard Development Company, L.P., Houston, TX (US)

(72) Inventors: Si-Ty Lam, Palo Alto, CA (US); Xia Sheng, Palo Alto, CA (US); Richard H. Henze, Palo Alto, CA (US); Zhang-Lin Zhou, San Diego, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days. days.

(21) Appl. No.: 14/898,380

(22) PCT Filed: Jul. 25, 2013

(86) PCT No.: PCT/US2013/052050
§ 371 (c)(1),
(2) Date: Dec. 14, 2015

(87) PCT Pub. No.: WO2015/012839
PCT Pub. Date: Jan. 29, 2015

(65) Prior Publication Data
US 2016/0141494 A1    May 19, 2016

(51) Int. Cl.
*H01L 29/04* (2006.01)
*H01L 45/00* (2006.01)
*H01L 27/24* (2006.01)

(52) U.S. Cl.
CPC ...... *H01L 45/1273* (2013.01); *H01L 27/2463* (2013.01); *H01L 45/08* (2013.01);
(Continued)

(58) Field of Classification Search
None
See application file for complete search history.

(56) References Cited

U.S. PATENT DOCUMENTS

| 5,705,232 A * | 1/1998 | Hwang | B05D 1/005 |
| | | | 257/E21.259 |
| 6,069,040 A * | 5/2000 | Miles | H01L 29/66825 |
| | | | 257/E21.422 |

(Continued)

FOREIGN PATENT DOCUMENTS

| KR | 100973362 B1 | 7/2010 |
| KR | 20120020265 A | 3/2012 |

(Continued)

OTHER PUBLICATIONS

Berzina, Tatiana, et al. "Optimization of an organic memristor as an adaptive memory element." Journal of Applied Physics 105.12 (2009): 124515-124515, 6 Pages.
(Continued)

*Primary Examiner* — David E Graybill
(74) *Attorney, Agent, or Firm* — Hewlett Packard Enterprise Patent Department

(57) ABSTRACT

A resistive memory device includes a bottom electrode and a top electrode sandwiching a switching layer. The device also includes a field enhancement (FE) feature that extends from the bottom electrode either into the switching layer or is covered by switching layer and that is to enhance an electric field generated by the two electrodes to thereby confine a switching area of the device at the FE feature. The device further includes a planar interlayer dielectric surrounding the device, for supporting the top electrode. A method of making a resistive memory device, employing in-situ vacuum deposition of all layers, is also provided.

10 Claims, 10 Drawing Sheets

(52) U.S. Cl.
CPC ........ *H01L 45/1233* (2013.01); *H01L 45/145* (2013.01); *H01L 45/146* (2013.01); *H01L 45/16* (2013.01); *H01L 45/1608* (2013.01); *H01L 45/1675* (2013.01)

(56) References Cited

U.S. PATENT DOCUMENTS

| | | | | |
|---|---|---|---|---|
| 6,730,081 | B1* | 5/2004 | Desai | A61B 17/00234 604/8 |
| 7,214,958 | B2* | 5/2007 | Happ | G11C 13/0004 257/4 |
| 7,326,951 | B2* | 2/2008 | Hsueh | H01L 45/06 257/2 |
| 7,678,607 | B2* | 3/2010 | Chiang | H01L 45/1633 257/4 |
| 7,704,789 | B2* | 4/2010 | Sun | H01L 45/1633 257/4 |
| 7,732,235 | B2* | 6/2010 | Scheuerlein | H01L 27/101 365/148 |
| 8,008,096 | B2* | 8/2011 | Fuchigami | H01L 45/08 257/E21.68 |
| 8,008,648 | B2* | 8/2011 | Bratkovski | H01L 45/08 257/14 |
| 8,097,878 | B2* | 1/2012 | Kumar | G11C 13/0007 257/2 |
| 8,114,468 | B2* | 2/2012 | Sandhu | H01L 27/101 257/4 |
| 8,207,593 | B2* | 6/2012 | Bratkovski | H01L 45/04 257/537 |
| 8,525,553 | B1* | 9/2013 | Yi | H03K 3/313 326/132 |
| 9,035,272 | B2* | 5/2015 | Sheng | H01L 45/1608 257/1 |
| 9,515,262 | B2* | 12/2016 | Wang | H01L 45/165 |
| 2003/0097129 | A1* | 5/2003 | Davison | A61B 18/14 606/41 |
| 2007/0164398 | A1* | 7/2007 | Li | C23C 14/0623 257/616 |
| 2008/0090337 | A1* | 4/2008 | Williams | G11C 13/0009 438/133 |
| 2008/0108176 | A1* | 5/2008 | Liang | H01L 45/06 438/102 |
| 2008/0185567 | A1* | 8/2008 | Kumar | H01L 45/1633 257/2 |
| 2008/0185572 | A1* | 8/2008 | Chiang | H01L 45/1633 257/4 |
| 2008/0203397 | A1* | 8/2008 | Amaratunga | H01L 31/028 257/77 |
| 2008/0296550 | A1* | 12/2008 | Lee | H01L 27/2409 257/2 |
| 2011/0017977 | A1* | 1/2011 | Bratkovski | H01L 45/08 257/14 |
| 2011/0169136 | A1* | 7/2011 | Pickett | H01L 27/24 257/537 |
| 2011/0227030 | A1* | 9/2011 | Pickett | H01L 45/1273 257/4 |
| 2011/0248381 | A1* | 10/2011 | Tong | H01L 21/26586 257/537 |
| 2011/0317471 | A1* | 12/2011 | Chien | G11O 5/025 365/148 |
| 2012/0014161 | A1* | 1/2012 | Pickett | H03B 7/06 365/148 |
| 2012/0025164 | A1* | 2/2012 | Deweerd | G11C 13/0004 257/5 |
| 2012/0032134 | A1* | 2/2012 | Yang | H01L 27/101 257/4 |
| 2012/0099362 | A1* | 4/2012 | Ribeiro | G11C 13/0007 365/148 |
| 2012/0104342 | A1* | 5/2012 | Yang | H01L 45/145 257/2 |
| 2012/0105159 | A1* | 5/2012 | Strachan | H03B 7/02 331/2 |
| 2012/0138885 | A1* | 6/2012 | Wu | H01L 45/04 257/5 |
| 2012/0202334 | A1* | 8/2012 | Kochergin | H01L 45/141 438/382 |
| 2012/0225534 | A1* | 9/2012 | Lee | H01L 27/2427 438/382 |
| 2012/0241712 | A1* | 9/2012 | Cai | H01L 27/2472 257/4 |
| 2012/0256150 | A1* | 10/2012 | Zagrebelny | H01L 21/3212 257/2 |
| 2012/0305880 | A1* | 12/2012 | Zhang | G11C 13/0007 257/4 |
| 2013/0168629 | A1* | 7/2013 | Ribeiro | H01L 45/08 257/3 |
| 2013/0169142 | A1* | 7/2013 | Hyde | H01J 3/021 313/296 |
| 2013/0176766 | A1* | 7/2013 | Pickett | G11C 11/39 365/148 |
| 2013/0221843 | A1* | 8/2013 | Cheatham, III | H01J 29/02 315/14 |
| 2013/0229105 | A1* | 9/2013 | Cheatham, III | H01J 29/02 313/153 |
| 2013/0229133 | A1* | 9/2013 | Cheatham, III | H01J 29/02 315/325 |
| 2013/0250420 | A1* | 9/2013 | Yang | G02F 1/015 359/573 |
| 2013/0313980 | A1* | 11/2013 | Cheatham, III | H01J 33/00 315/161 |
| 2014/0027705 | A1* | 1/2014 | Yang | H01L 45/04 257/5 |
| 2014/0029327 | A1* | 1/2014 | Strachan | H01L 45/04 365/148 |
| 2014/0070696 | A1* | 3/2014 | Cheatham, III | H01J 29/481 315/14 |
| 2014/0086806 | A1* | 3/2014 | Li | H01L 27/101 422/199 |
| 2014/0197369 | A1* | 7/2014 | Sheng | H01L 45/1608 257/4 |

FOREIGN PATENT DOCUMENTS

WO    WO-2010151844    12/2010
WO    WO 2015012839 A1 *    1/2015  ............. H01L 45/08

OTHER PUBLICATIONS

Choi, Kyung Hyun, et al. "Cost-effective printed memristor fabrication and analysis." Cellular Nanoscale Networks and Their Applications (CNNA), 2012 13th international Workshop on. IEEE. 2012, 4 Pages.

Deleruyelle, D. et al. "Direct Observation at Nanoscale of Resistance Switching in NiO Layers by Conductive-Atomic Force Microscopy." Applied physics express 4.5 (2011): 1101, 3 Pages.

International Searching Authority, The International Search Report and the Written Opinion, Apr. 30, 2014, 12 Pages.

La, Young-Hye, et al. "Directed assembly of cylinder-forming block copolymer films and thermochemically induced cylinder to sphere transition: a hierarchical route to linear arrays of nanodots." Nano letters 5.7 (2005), 6 Pages.

Li, Shuyan, et al. "Self-assembled diblock copolymer thin films for the analysis of bacteria-surface interactions." Smart Materials, Nano-and Micro-Smart Systems. International Society for Optics and Photonics, 2008, 8 Pages.

Park, Ji-Woong, et al. "A surface-reactive rod-coil diblock copolymer: Nano-and micropatterned polymer brushes." Journal of the American Chemical Society 124.4 (2002): 514-515.

Shuang, P. et al., Meinristor Crossbar Arrays with Junction Areas towards Sub-10 x10 nm2 (Research Paper), 13th International Workshop on Cellular Nanoscale Networks and Their Applications, Aug. 29-31, 2011, 1 Page.

* cited by examiner

400

Provide a substrate on which bottom contact lines and pads may be patterned on an insulating layer on the substrate
402

Deposit all the materials comprising the memristor bit layer by layer in-situ on the contact lines and define the bits, including a bottom electrode, a diffusion barrier, a switching material, a non-linear select element, and a top electrode
404

Pattern the bits with a lithography and etching process
406

Perform a planarization and etch back of a thick insulating layer in which the insulating layer is deposited on the wafer that covers all the memristor material and then etched back to the expose upper portions of the bit layer
408

Form top electrode contact lines and pads, using a diffusion barrier, to contact exposed upper portions of the bit layer
410

Fig. 4

RESISTIVE MEMORY DEVICE HAVING FIELD ENHANCED FEATURES

BACKGROUND

Resistive memory elements can be programmed to different resistive states by applying programming energy. After programming, the state of the resistive memory elements can be read and remains stable over a specified time period. Large arrays of resistive memory elements can be used to create a variety of resistive memory devices, including non-volatile solid state memory, programmable logic, signal processing, control systems, pattern recognition devices, and other applications. Examples of resistive memory devices include memristors, phase change memory, and spin-transfer torque.

Memristors are devices that can be programmed to different resistive states by applying a programming energy, for example, a voltage or current pulse. This energy generates a combination of electric field and thermal effects that can modulate the conductivity of both non-volatile switch and non-linear select functions in a memristive element. After programming, the state of the memristor can be read and remains stable over a specified time period. Memristive elements can be used in a variety of applications, including non-volatile solid state memory, programmable logic, signal processing, control systems, pattern recognition, and other applications.

BRIEF DESCRIPTION OF THE DRAWINGS

FIG. 4 depicts a flow chart of the process shown in FIGS. 3A-3E.

Throughout the drawings, identical reference numbers designate similar, but not necessarily identical, elements.

DETAILED DESCRIPTION

Figure 1A:
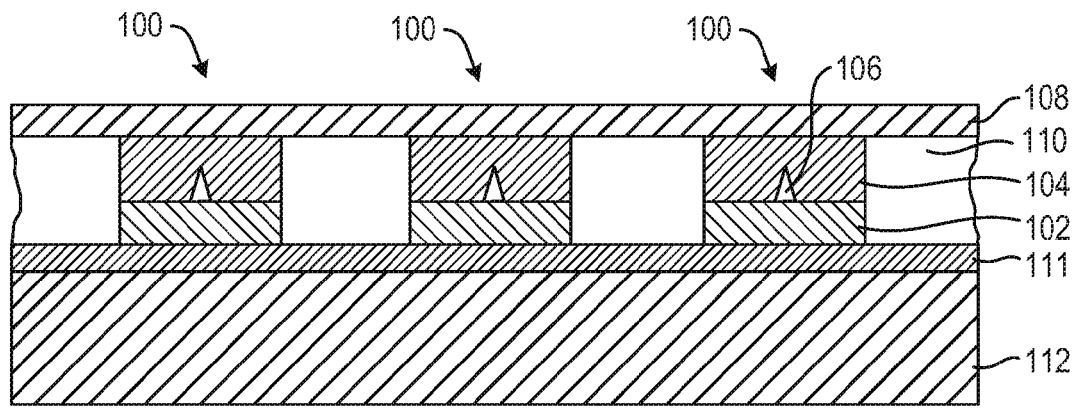
FIG. 1A is a schematic diagram of a resistive memory device, in accordance with an example.

In the following description, numerous details are set forth to provide an understanding of the examples disclosed herein. However, it will be understood that the examples may be practiced without these details. While a limited number of examples have been disclosed, it should be understood that there are numerous modifications and variations therefrom. Similar or equal elements in the Figures may be indicated using the same numeral.

As used in the specification and claims herein, the singular forms "a," "an," and "the" include plural referents unless the context clearly dictates otherwise.

As used in this specification and the appended claims, "approximately" and "about" mean a ±10% variance caused by, for example, variations in manufacturing processes.

In the following detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims.

Resistive memory elements can be used in a variety of applications, including non-volatile solid state memory, programmable logic, signal processing, control systems, pattern recognition, and other applications.

As used in the specification and appended claims, the term "resistive memory elements" refers broadly to programmable non-volatile resistors such as resistive random access memory (ReRAM), phase change memory (FORAM), memristor technology based on perovskites (such as Sr(Zr) TiO$_3$), transition metal oxides (such as NiO or TiO$_2$ or TaO$_x$), chalcogenides (such as Ge$_2$Sb$_2$Te$_5$ or AgInSbTe), solid-state electrolytes (such as GeS, GeSe, Cu$_2$S), organic charge transfer complexes (such as CuTCNQ), organic donor-acceptor systems, various molecular systems, or other non-volatile programmable resistive memory elements.

Memristors, or memristive devices, are nano-scale or micro-scale devices that may be used as a component in a wide range of electronic circuits, such as memories, switches, and logic circuits and systems. In a memory structure, a crossbar of memristors may be used. For example, when used as a basis for memories, the memristor may be used to store a bit of information, 1 or 0, corresponding to whether the memristor is in its high or low resistance state (or vice versa). When used as a logic circuit, the memristor may be employed as configuration bits and switches in a logic circuit that resembles a Field Programmable Gate Array, or may be the basis for a wired-logic Programmable Logic Array. It is also possible to use memristors capable of multi-state or analog behavior for these and other applications.

The memristor may either be in a low resistance ("ON") or high resistance ("OFF") state. During the last few years, researchers have made great progress in finding ways to make the switching function of these memristors behave efficiently. For example, tantalum oxide (TaO$_x$)-based memristors have been demonstrated to have superior endurance over other nano-scale devices capable of electronic switching. In lab settings, tantalum oxide-based memristors are capable of over 10 billion switching cycles.

A memristor may comprise a switching material, such as TiO$_x$ or TaO$_x$, sandwiched between two electrodes. Memristive behavior is achieved by the movement of ionic species (e.g., oxygen ions or vacancies) within the switching material to create localized changes in conductivity via modulation of a conductive filament and/or tunnel barrier between two electrodes, which results in a low resistance "ON" state, a high resistance "OFF" state, or intermediate states. Initially, when the memristor is first fabricated, the entire switching material may be nonconductive. As such, a forming process may be required to form the conductive channel in the switching material between the two electrodes. A known forming process, often called "electroforming", includes applying a sufficiently high (threshold) voltage across the electrodes for a sufficient length of time to cause a nucleation and formation of a localized conductive channel (or active region) in the switching material. The threshold voltage and the length of time required for the forming process may depend upon the type of material used for the switching material, the first electrode, and the second electrode, and the device geometry.

Metal or semiconductor oxides may be employed in memristive devices; examples include either transition metal oxides, such as tantalum oxide, titanium oxide, yttrium oxide, hafnium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include transition metal nitrides, such as tantalum nitride and titanium nitride.

Prior art memristive devices may include a continuous oxide film between the electrodes. Filaments/ionic diffusion are formed in the oxide film between the electrodes in a random fashion, much like lightning, that may take the path of least resistance. This random path causes variations in the memristor I-V characteristics from switching cycle to cycle and especially from device to device. Prior art memristive or non-volatile resistive memory devices that are either unipolar or bipolar tend to have this random conductive path between the electrodes. This randomness in the conductive channel formation may influence device variability and/or reliability issues.

In a memristor device, the interfaces between the top/bottom electrodes and the switching material may be very sensitive to any contamination because the switching occurs at the interfaces. Presently, in the fabrication of memristors, the interfaces of the electrodes and the active material may suffer contamination from a series of events such as exposing to air, solvent, and deionized water rinsing, plasma treatment, photolithography processes and so on.

In accordance with the teachings herein, a resistive memory device includes a bottom electrode and a top electrode sandwiching a switching layer. The device also includes a field enhancement (FE) feature that extends from the bottom electrode. The FE may extend either into the switching layer or is covered by switching layer, but does not extend all the way to touch top electrode.

The FE feature is to enhance an electric field generated by the two electrodes to confine a switching area of the device at the FE feature. The device further includes a planar interlayer dielectric (ILD) surrounding the device. The ILD electrically isolates the bottom electrode and the top electrode of the device and, being planar, supports the top electrode.

With the FE feature, an electric field is enhanced at the FE feature, thus, a voltage for initial electroforming and/or subsequent driving of the device is reduced. Furthermore, the uniformity and the reliability in operation of the device in an array configuration will be much improved with greater control. The FE features may be formed by a combination of deposition, lithography and etching processes. The term "lithography" may include photolithography, e-beam lithography, ion beam lithography, nanoimprint lithography, nanosphere lithography, and/or block copolymer lithography.

Figure 1B:
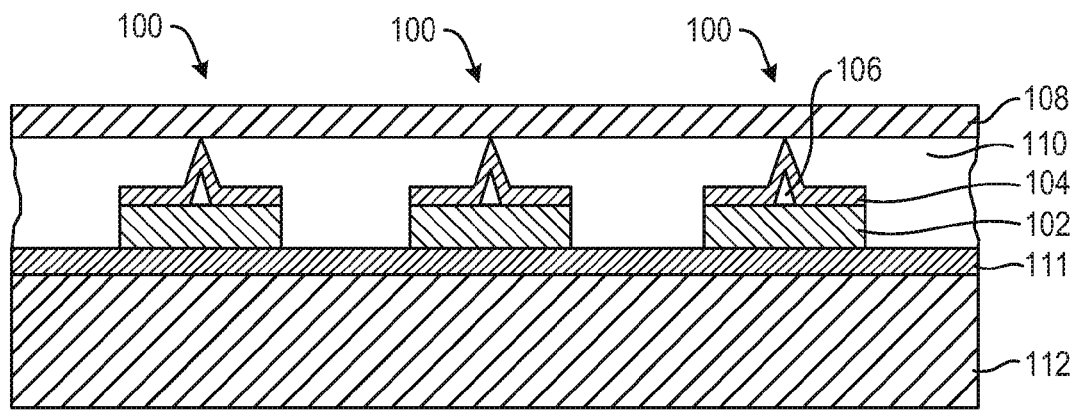
FIG. 1B is a schematic diagram of a resistive memory device, in accordance with another example.

FIGS. 1A-1B depict the basic structure of such a resistive memory device 100, including bottom electrode 102, switching layer 104, FE feature 106, top electrode 108, and ILD 110. The bottom electrode 102 may be supported on an insulating layer 111, in turn supported on a substrate 112. In FIG. 1A, the FE feature 106 extends into the switching layer 104, while in FIG. 1B, the FE is covered by the switching layer.

Also in accordance with the teachings herein, a process of fabricating two-dimensional (2D) memristor arrays is provided, using in-situ deposition, e.g., in situ vacuum deposition, of the materials and etching processes to form the bottom electrode and switching element of the resistive memory device. The whole structure is then embedded in a non-conductive material (interlayer dielectric—ILD) which serves multiple purposes of electric isolation, planarization and passivation. A planar surface may be desired for 3D stacking of the memristor arrays for high density devices.

Figure 2:
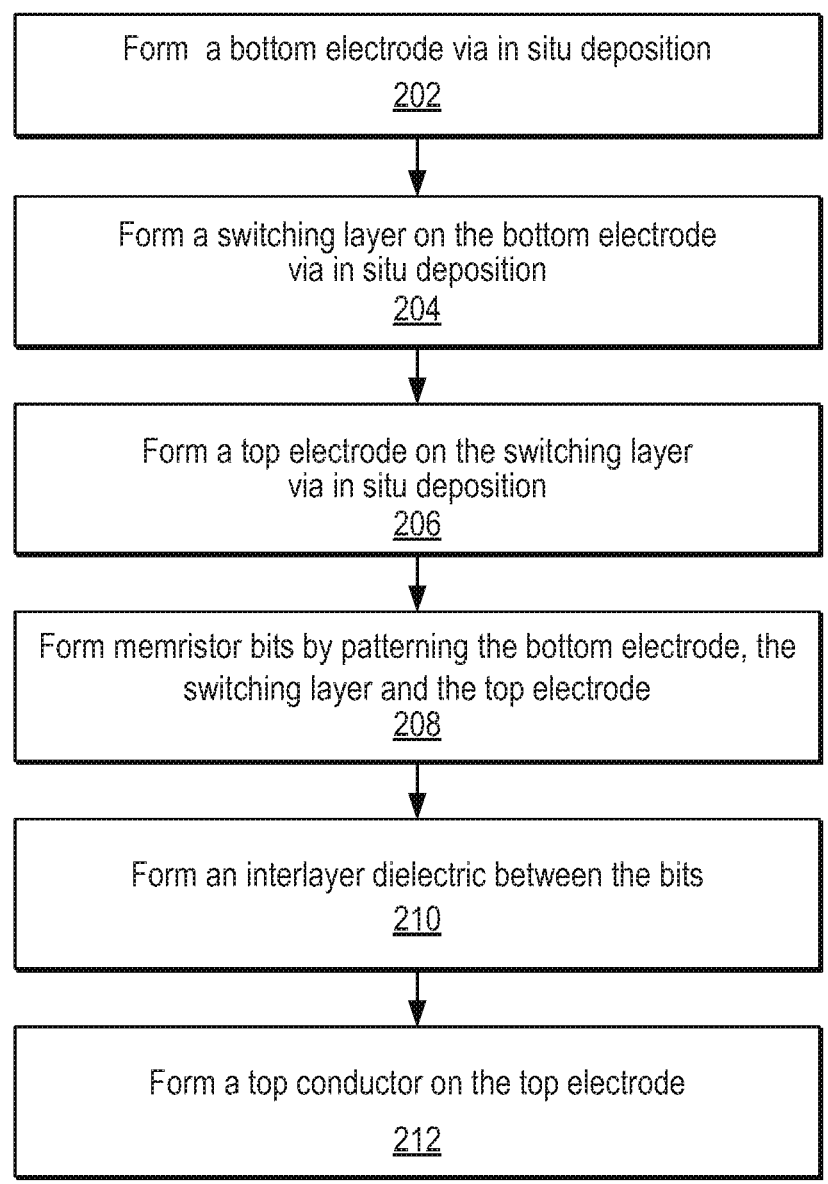
FIG. 2 depicts a flow chart of a process for forming a resistive memory device, in accordance with an example.

The foregoing process is illustrated in the flow chart depicted in FIG. 2. The process 200 includes forming 202 the bottom electrode 102 and continues with forming 204 the switching layer 104 on the bottom electrode. Next, the top electrode 108 may be formed 206 on the switching layer 104. These processes may be performed in-situ. Memristor bits (described with reference to FIGS. 3A-3E) may be formed 208 by patterning the bottom electrode 102, switching layer 104, and top electrode 108. The process 200 further includes forming 210 the ILD 110 between the bits and etching back to expose the top electrode 108. The process 200 concludes with forming 212 a top conductor and contact pad 310 (shown in FIG. 3E) to the top electrode 108.

Other layers may be included as desired, also in the in-situ vacuum deposition. Such other layers may include a diffusion barrier (not shown in FIGS. 1A-1B, but shown in FIGS. 3B-3E as element 306) between the bottom electrode 102 and the switching material 104, such as titanium nitride (TiN) and/or tantalum nitride (TaN), and a select layer (not shown in FIGS. 1A-1B, but shown in FIGS. 3B-3E as element 308 and FIGS. 5D and 5E as element 106$a$) such as a negative differential resistance (NDR) material or a tunnel barrier between the switching material layer 104 and the top electrode 108 to increase non-linear characteristics of the device.

Further in accordance with the teachings herein, solution-based materials such as polymers, monomers, and oligomers may be used as the nonconductive material (ILD) 110 in memristor devices. The materials may also include cross-linkers and photoinitiators, thermal-initiators, or e-beam initiators. SU8, which is a high contrast, epoxy based photoresist designed for micromachining and other microelectronic applications, refers to a series of photoresists available from MicroChem (Newton, Mass.), and may be used in the practice of the teachings herein. These resist materials can be used as a combination insulating layer, planarization layer, and encapsulation layer. Manufacturing methods and processes for using polymeric materials in memristor devices are disclosed.

The details of the fabrication method are now described with reference to FIGS. 3A-3E.

Figure 3A:
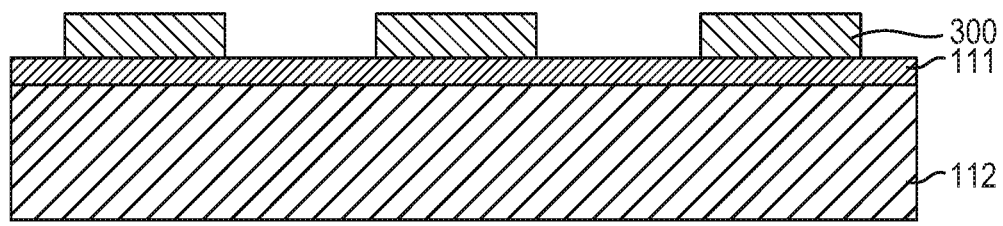
FIGS. 3A-3E illustrates a process for in-situ deposition of a switching stack in a resistive memory device, including a bottom electrode, active switching layer, buffer layer, and top electrode, in accordance with an example.

A substrate 112, such as a silicon (Si) wafer, may be provided, on which bottom conductor contact lines and pads 300 may be patterned on an insulating layer 111, such as SiO$_2$, on the substrate. The formation and patterning, such as by photolithography, of the bottom conductor contact lines and pads 300 may be performed by conventional methods. The resulting structure is depicted in FIG. 3A.

Figure 3B:
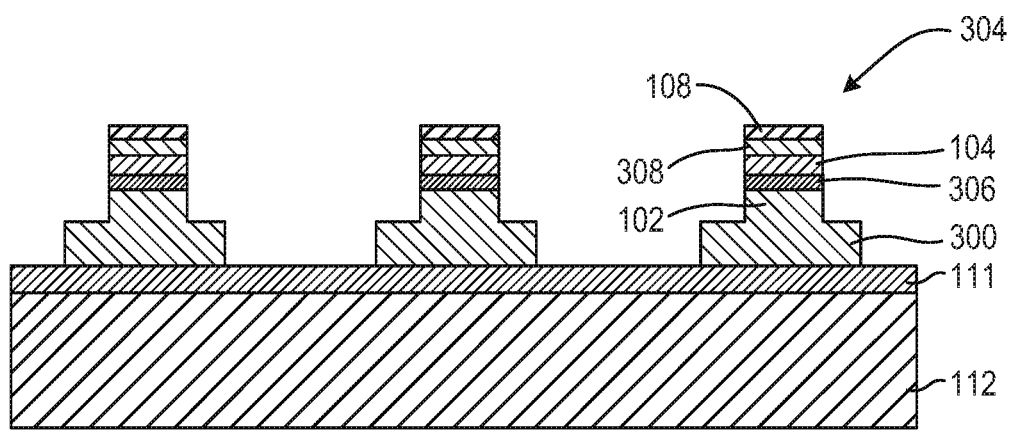

Next, all the materials comprising a memristor bit 304 may be deposited layer by layer in-situ, such as in a sputter vacuum chamber, and the bits may be defined on the bottom conductor 300 such as by photolithography. The bit stack 304 may include the complete set of the materials involved in the memristor device, including, without limitation, a bottom electrode 102, a diffusion barrier 306, the switching material 104, and a non-linear select element 308 (described below). The top electrode 108 on top of the bit stack 304 completes the device. In some examples, one or both of the diffusion barrier 306 and the non-linear select element 308 may be omitted. The patterning of the bits 304 may performed by conventional reactive ion etching, ion beam milling or liftoff process. The resulting structure is depicted in FIG. 3B.

Figure 3C:
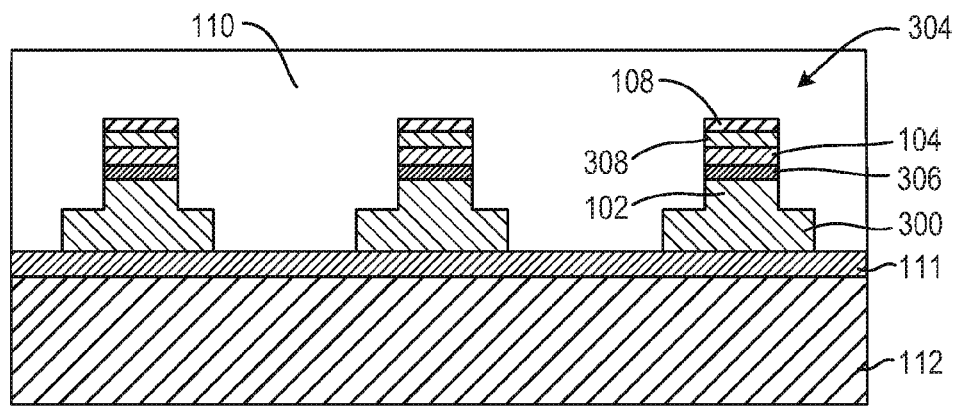
Figure 3D:
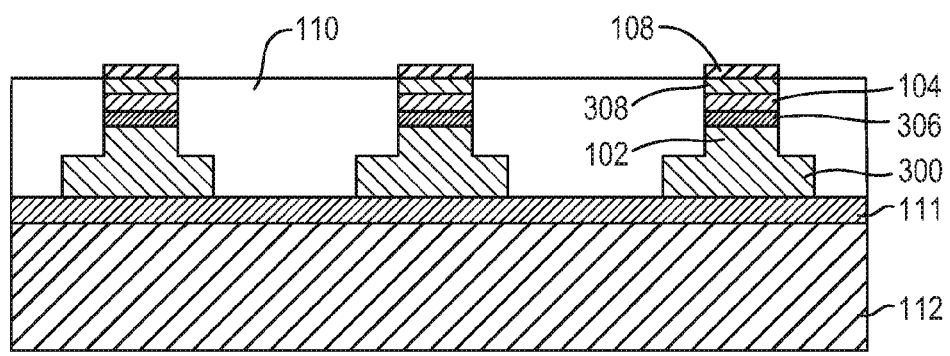

Thirdly, a planarization and etch back of an insulating layer 110 is carried out as shown in FIGS. 3C and 3D. The insulating layer 110, also known as the ILD, is deposited on the wafer that covers all the memristor bit 304 and between adjacent bits. Examples of ILD materials include, but are not limited to, SiO$_2$ (by sputtering, evaporation, tetraethyl orthosilicate (TEOS), plasma-enhanced chemical vapor deposition (PECVD), etc.), Al$_2$O$_3$, or the UV-curable (e.g., SU8), thermally-curable materials, or e-beam curable materials described above, and the like. The insulating layer 110 may include two or more layers with different materials. There are several ways of performing the planarization as described below. The etch-back process may be a conventional reactive ion beam etching process using one or a mixed gas of CF$_4$, CHF$_3$, C$_4$F$_8$, O$_2$, Ar, Cl$_2$, and/or HBr.

One example of performing the planarization of the surface of the insulating layer 110 is by conventional chemical mechanical planarization (CMP). Another example of performing the planarization of the surface of the insulating layer 110 is by spin coating or bar coating the insulating material in a liquid form. A solid layer may be formed by evaporating the solvent or by UV/thermal curing. An adhesion promotion treatment may be needed before the coating. The thickness of the coating may be significantly greater to make a planar surface. In some cases, a flat surface (not shown) may be placed on top of the coating with pressure to help to achieve a good planarization. After that, a reactive ion etching may be carried out to etch the insulating material all the way down until the top surface of the memristor stack 304 is exposed, such as at least a portion of the top electrode 108. A slight over etch of a few nanometers may help to ensure that the surface of the top of the memristor stack 304 is clean of any insulating material 110.

Figure 3E:
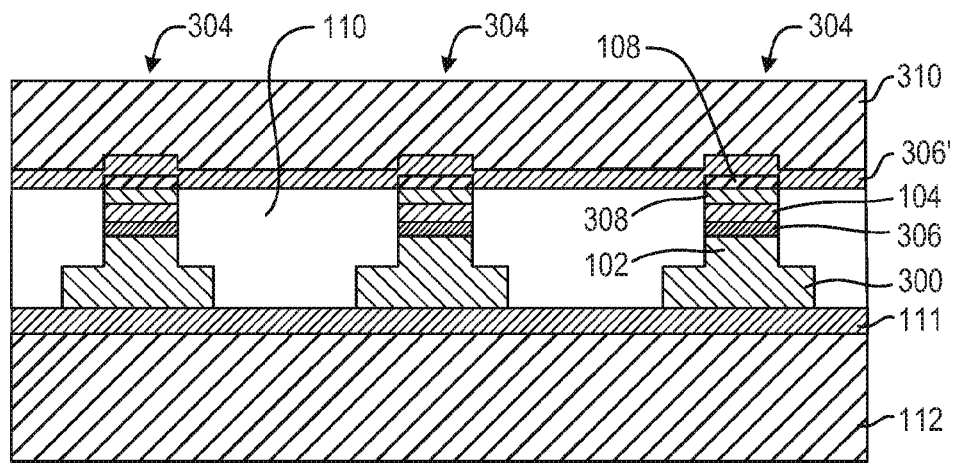

Last, the top conductor contact lines and pads 310 may be fabricated in the similar way of the bottom conductor/electrode 300/102, with a diffusion barrier 306' in some cases. The final structure is depicted in FIG. 3E.

The bottom conductor and contact pad 300 and bottom electrode 102 may be formed on insulating layer 111 by any of a number of processes, including electroplating, sputtering, evaporation, ALD, co-deposition, chemical vapor deposition, IBD (ion beam deposition), or any other film deposition technology performed in a vacuum. Examples of bottom conductor 300/bottom electrode 102 materials include, but are not limited to, aluminum (Al), copper (Cu), platinum (Pt), tungsten (W), gold (Au), titanium (Ti), silver (Ag), ruthenium dioxide (Ru$_{O2}$), titanium nitride (TiN), tungsten nitride (W$_{N2}$), tantalum (Ta), tantalum nitride (TaN) or the like, as well as doped silicon. The electrodes 102 may be patterned, if desired. The thickness of the bottom electrode 102 may be in the range of about 10 nm to a few micrometers.

The diffusion barriers 306, 306' may be any material that prevents metal diffusion, such as tantalum nitride (TaN), titanium nitride (TiN), tungsten silicide (WSi), and tungsten carbide (WC). The diffusion barriers 306, 306' may be the same or different.

The material of the switching layer 104 may be a metal oxide or semiconductor oxide; examples include either transition metal oxides, such as tantalum oxide, titanium oxide, yttrium oxide, hafnium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include transition metal nitrides, such as tantalum nitride and titanium nitride.

The non-linear select element 308 may be a negative differential resistance (NDR) layer, such as NbO$_2$, SnO$_2$, or VO$_2$.

The top electrode 108 may be formed on the non-linear select element 308 (or on the switching layer 104 if the non-linear select element is omitted) by any of the processes listed above for the bottom conductor 300/bottom electrode 102. Examples of top electrode 108 materials include, but are not limited to, the same as those listed above for the bottom conductor 300/bottom electrode 102. The top electrode 108 material may or may not be the same as the bottom conductor 300/bottom electrode, 102 material. The thickness of the top electrode 108 may be in the range of about 10 nm to a few micrometers. The top conductor and contact pads 310 may be supported on the planarized ILD 110, with or without the diffusion barrier 306' between the top conductor/contact pads and the ILD, to contact the top electrode 108.

A simple photolithographic process may be used to form the interlayer dielectric (ILD) structures 110 by using a photosensitive polymeric material such as SU8 epoxy. The ILD layer 110 can be formed by a simple wet coating technique such as spin casting, gravure coating, spray coating or dip coating. Thickness of the layer can be controlled precisely with a wide range of thicknesses depending on the device requirements. Subsequently, the ILD 110 is exposed to UV light through a photomask and then developed. The ILD structures 110 are formed and cured and become part of the resistive memory device structure.

Alternatively, an imprintable resist may be applied to a wafer, such as by any of the techniques described above. With an imprinted master, the ILD structures 110 can be formed by an imprint process. Once the ILD structures 110 are fully cured, they become part of the resistive memory device structure.

An example process 400 is depicted in FIG. 4. The process 400 includes providing 402 a substrate 112 over which bottom conductor contact lines and pads 300 may be patterned on an insulating layer 111 on the substrate.

The process 400 continues with depositing 404 all the materials comprising the memristor bit layer 304 layer by layer in-situ on the contact lines 300 and defining the bits 304, including the bottom electrode 102, the diffusion barrier 306, the switching material 104, the non-linear select element 308, the diffusion barrier 306', and the electrode 108.

The process 400 continues with patterning 406 the bits 304 with a lithography and etching process.

The process 400 then continues with performing 408 a planarization and etch back of the thick insulating layer (ILD) 110, in which the insulating layer is deposited on the wafer that covers all the bit stack 304 materials and then etched back to expose upper portions of the bit stack.

The process 400 then concludes with forming 410 the top contact lines and pads 310 to contact exposed upper portions of the bit stack 304.

Non-uniformity in device forming and operation of a given array of memristors is a well-known issue. This, in turn, leads to concerns about the uniformity and reliability of the array. With field enhanced (FE) features, however, the electric field may be enhanced by as much as three times at the FE features as compared with their surroundings. As a result, the driving voltage to form and activate the switching is reduced accordingly. Furthermore, the switching area of the device is well-defined and confined at the FE feature. This may enhance the uniformity of device performance and reliability.

Manufacturing processes for forming FE features in memristor devices are shown in the attached FIGS. 5A-5E. Some layers shown in FIGS. 5A-5E are omitted for clarity.

Figure 5A:
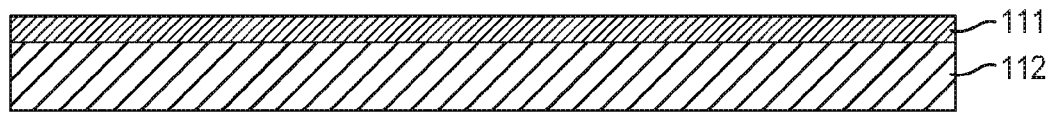
FIGS. 5A-5E illustrates a process for fabricating a resistive memory device with a field enhanced feature, according to an example.

A substrate 112 may be provided, with an insulating layer 111, such as SiO2, thereon, as shown in FIG. 5A. It will be appreciated that the substrate and insulating layer along with bottom conductors can alternatively be defined by the top layer of a CMOS circuit designed and fabricated to drive the memristor array, or by layers of a similar memristor array beneath the currently fabricated structures.

Figure 5B:
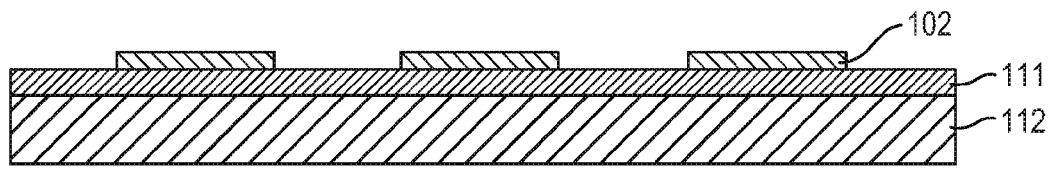

Bottom electrode 102 may be formed on the insulating layer 111 and then patterned, as shown in FIG. 5B.

Figure 5C:
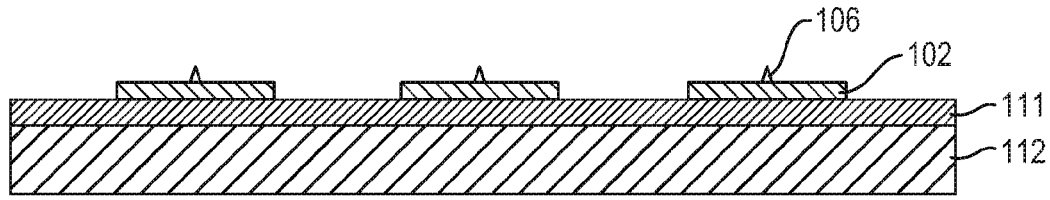

Field enhanced features 106 may be formed on the bottom electrode 102, as shown in FIG. 5C. Typically, one FE feature 106 may be formed on each patterned bottom electrode 102, although more than one FE feature may be formed on the patterned bottom electrode in some examples.

The FE features 106 may have a width (at base) of about 5 to 20 nm and an aspect ratio (height:width) in the range of about 1:1 to 3:1. The composition of the FE features 106 depends on how they are formed. For example, lithography (electron beam—ebeam, ion beam—ibeam—or self-assembly lithography) followed by etching may be employed to form a sharp structure (e.g., needle-like, such as depicted in FIGS. 7A-7D below) using a conductive material. In another example, imprint lithography may be employed using UV-curable polymers and etching. In yet another example, a process that is similar to the Spindt-type field-emission-tip process, by evaporation of a metal, such as molybdenum (Mo), a refractory metal or an alloy, may be employed to form FE features, and followed by etching using a mask formed self-assembly lithography, such as nano sphere lithography or diblock copolymer lithography. The Spindt-type process is further described in C. A. Spindt, "A thin-film field-emission cathode", Journal of Applied Physics, vol. 39, no. 7, pages 3504-3505, 1968, and U.S. Pat. No. 3,755,704, granted on Aug. 28, 1973.

The FE features 106 in this example may be more "blocky", and a few nm in width and height, such as shown in FIGS. 8A-8D below. In this example, the field concentration is created by the small dimensions or sharp angular geometry of the FE feature protruding from a flat surface. In another example, FE 106 can be deposited as metal nanoparticles from a fluid.

Figure 5D:
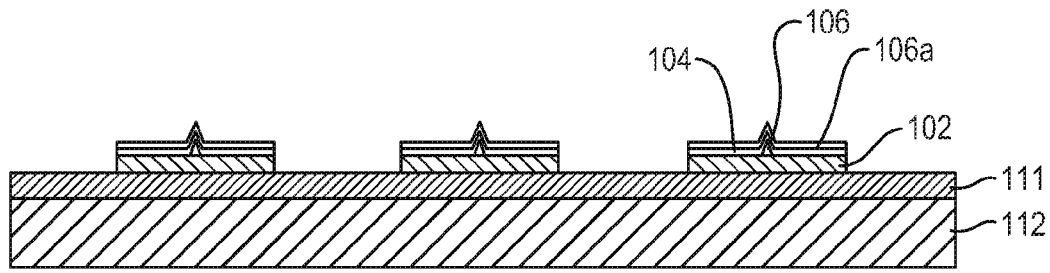

Switching material 104 may be formed on the patterned bottom electrode 102 with FE feature 106, as shown in FIG. 5D.

After forming an interlayer dielectric (ILD) 110 on and between memristor bits 100, a continuous top electrode 108 may be formed on the top of the switching material 104 and ILD 110. The ILD 110 may be planarized.

Figure 6:
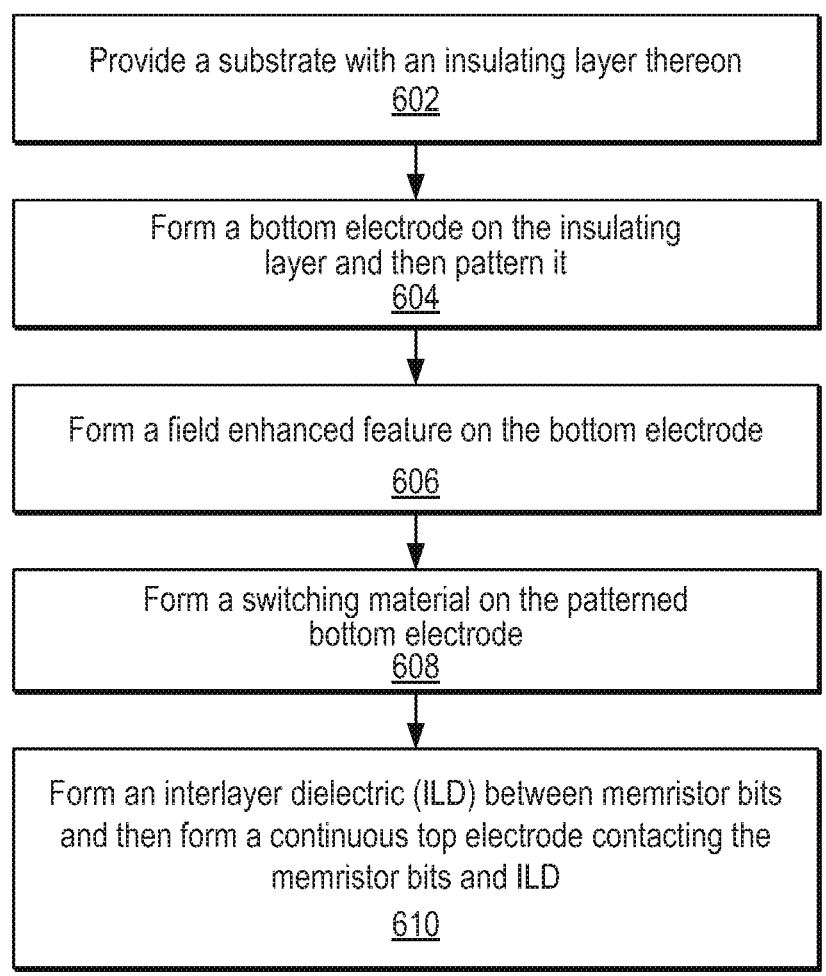
FIG. 6 depicts a flow chart of the process shown in FIGS. 5A-5E.

An example process 600 is depicted in FIG. 6. The process 600 starts with providing 602 substrate 112 with insulating layer 111 thereon and continues with forming 604 bottom electrode 102 on the insulating layer and then patterning it.

The process 600 continues with forming 606 field enhanced feature 106 on each patterned bottom electrode 102.

The process 600 then continues with forming 608 switching material 104 on the patterned bottom electrode 102 with FE feature 106.

The process 600 concludes with forming 610 interlayer dielectric (ILD) 110 between resistive memristor devices 100 and then forming continuous top electrode 108 contacting the memristor devices, the FE features, and the ILD.

Figure 5E:
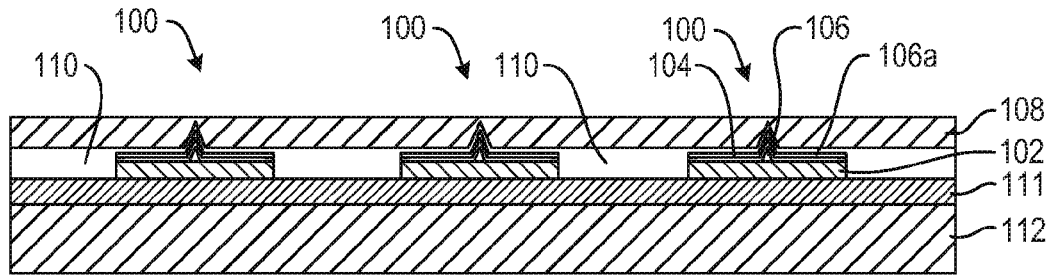

FIGS. 7A-7D depict two examples of processes for arriving at the structure depicted in FIG. 5E. The first example uses a combination of deposition, photolithography, and etching processes, while the second example uses a combination of deposition, nanoimprint lithography, and etching processes. Some layers shown in FIGS. 7A-7D are omitted for clarity.

Figure 7A:
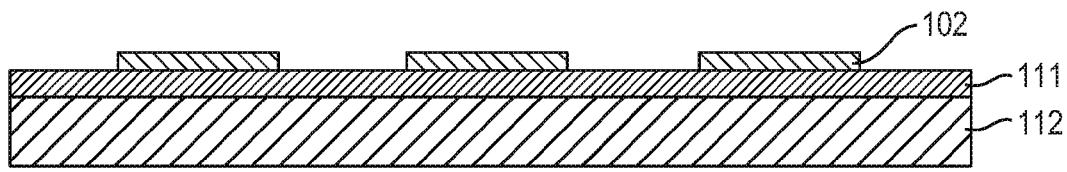
FIGS. 7A-7D depict details of a process for fabricating a resistive memory device with a field enhanced feature, according to an example.
Figure 7B:
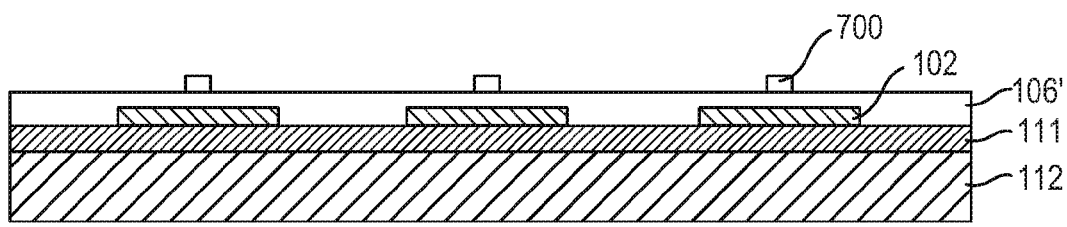
Figure 7C:
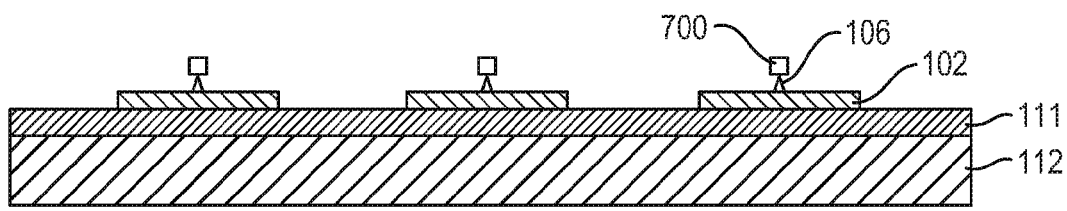
Figure 7D:
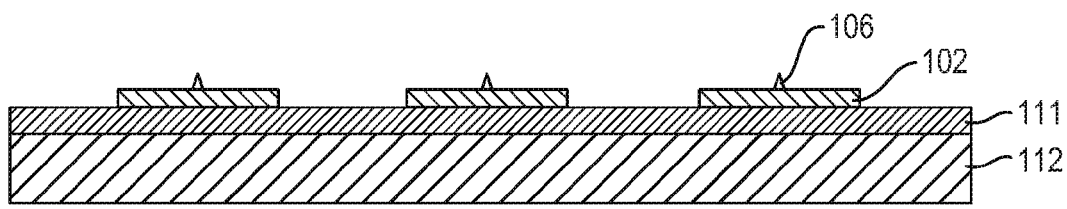
Figure 8A:
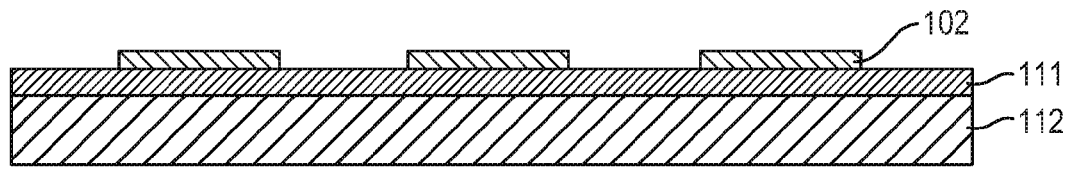
FIGS. 8A-8D depict details of another process for fabricating a resistive memory device with a field enhanced feature, according to an example.
Figure 8B:
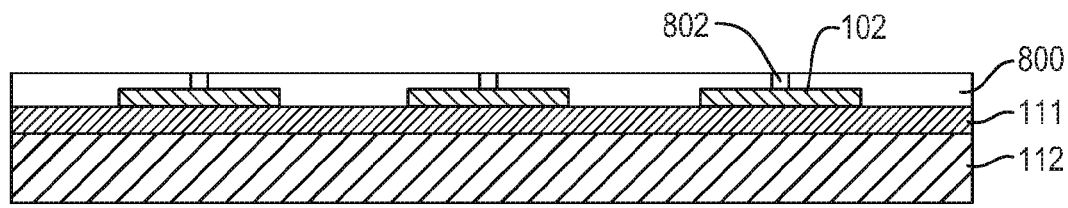
Figure 8C:
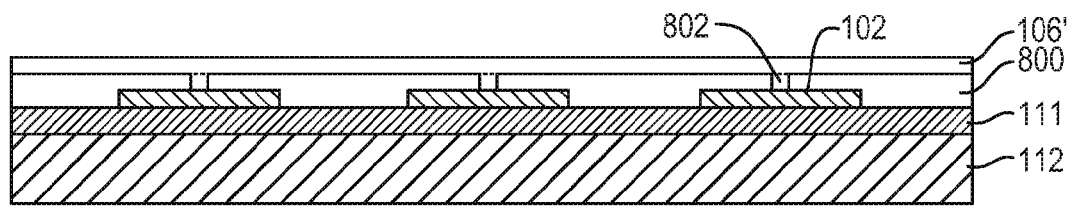
Figure 8D:
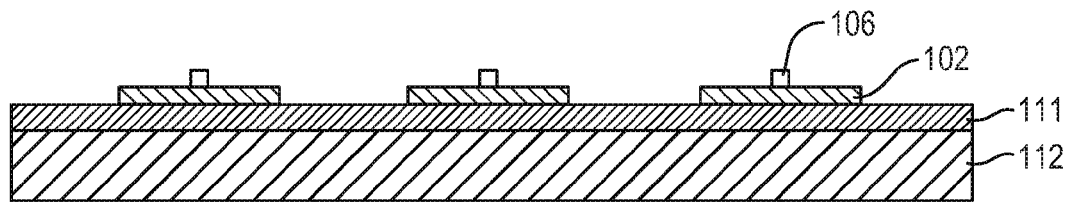

In the first example process, a substrate 112 supporting an insulating layer 111 in turn supporting a bottom electrode 102 of the resistive memory device may be provided, as shown in FIG. 7A. Next, a layer 106', such as an oxide, silicon, polysilicon, a nitride or a metal, used to form the FE feature 106 is deposited on the substrate. A photolithography mask 700 may be applied to define a resist pattern of FE features 106, as shown in FIG. 7B (the FE features 106 are shown in FIG. 7C). An etching process such as reactive ion etching or ion beam etching may be used to etch the FE layer 106' through the resist mask 700, as shown in FIG. 7C, Once the FE layer etching process done, the remainder of the resist mask is removed and cleaned, thereby leaving the FE features 106, as shown in FIG. 7D. With the FE features 106 on the bottom electrode 102, the switching layer 104, ILD 110, and top electrode 108 are then formed to complete the memristor device process, as shown in FIG. 5E.

In the second example process, in place of the use of a photolithography mask, as described above with reference to FIG. 7B, a nanoimprint process is applied to define an imprinted mask pattern of FE features. This pattern does not need to be regularly spaced as shown, as long as every bit is subjected to at least one FE feature 106. An etching process such as reactive ion etching or ion beam etching to etch the FE layer through the resist mask, as described above with reference to FIG. 7C. The process continues as described above with reference to FIG. 7D.

Yet another example process is depicted in FIGS. 8A-8D. In this example, block-copolymers may be used as a mask for forming field enhanced (FE) features 106 in resistive memory devices. A substrate 112 supporting an insulating layer 111 in turn supporting a bottom electrode 102 of the resistive memory device may be provided. Next, a layer 800 of block-copolymer is applied over the substrate 112 and by the nature of the polymers, nano-scale pores 802 are formed, such as by spin-coating. The block copolymer is one that may form pores on the order of 2 to 50 nm in diameter.

"Block copolymer" refers to a polymer having two or more chemically differentiated polymer blocks. In some examples the blocks have different physical properties such as different degrees of hydrophilicity or hydrophobicity, and are non-miscible over a range of temperatures, which means that the blocks form separate domains in the melt phase. This type of block copolymer can be synthesized by living polymerization methods such as atom transfer radical polymerization (ATRP), fragmentation chain transfer polymerization (RAFT), nitroxide-mediated polymerization (NMP), etc. The molecular weight of the copolymer may be selected so that the end-to-end distance of the block is commensurate with smallest feature of the pattern. In some examples, molecular weights for each block of a block copolymer range from about 200 to 1,000,000 (weight average). The feature sizes may be as small as a few nm. Examples of such block co-polymers include poly(styrene-b-dimethylsiloxane) and poly(methyl methacrylate-b-styrene).

After spin-coating, a baking is carried out, and the block copolymer is phase-segregated. A UV exposure is then followed to break the bonds between blocks. The layer is then developed in a solvent that removes only one material and leave another material (with nano holes or pores) to serve as a mask. See, for example, Craig J. Hawker and Thomas P. Russell, "Block Copolymer Lithography: Merging "Bottom-Up" with "Top-Down" Processes", MRS BULLETIN•VOLUME 30•December 2005, p. 952.

The porous polymer layer 800 is used as deposition mask, An FE layer 106' is then deposited on the surface of the polymer layer 800 and into the pores 802. Once the deposition process is done, the polymer layer 800 is removed, such as by dissolving in solvent, leaving FE features 106 behind. With the FE features 106 on the bottom electrode 102, the switching layer 104, ILD 110, and top electrode 108 are then formed to complete the resistive memory device process as shown above for FIG. 5E.

Figure 9:
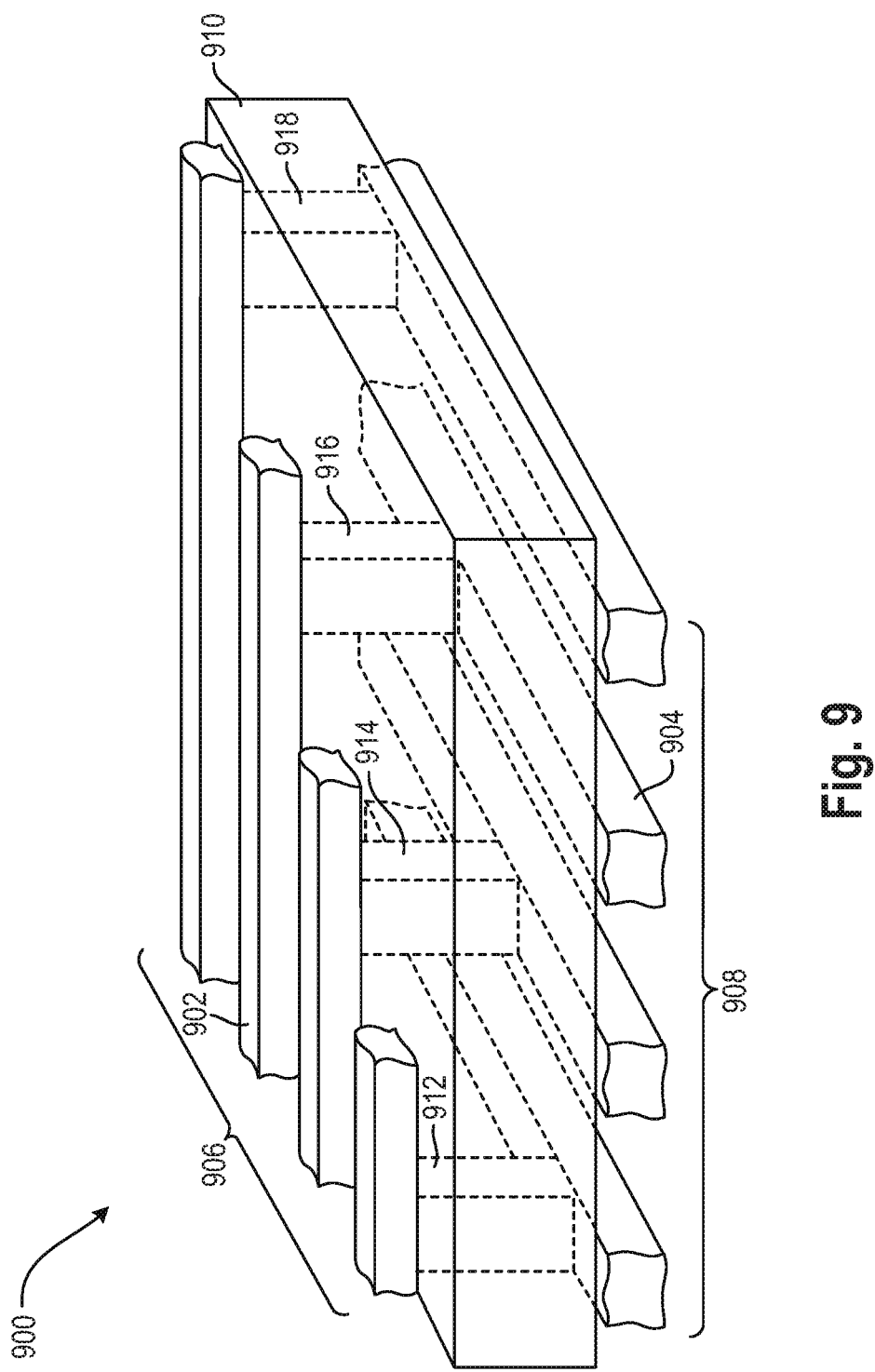
FIG. 9 is an isometric view of a crossbar architecture incorporating resistive memory devices such as shown in the foregoing Figures, according to an example.

The resistive memory device 100 may be used in a memory array. FIG. 9 shows a perspective view of a nanowire memory array, or crossbar, 900, revealing an intermediate layer 910 disposed between a first layer of approximately parallel nanowires 908 and a second layer of approximately parallel nanowires 906. The first layer of nanowires may be at a non-zero angle relative to the second layer of nanowires.

According to one illustrative example, the intermediate layer 910 may be a dielectric layer, such as ILD 110. A number of the resistive memory devices 912-918 may be formed at the intersections, or junctions, between nanowires 902 in the top layer 906 and nanowires 904 in the bottom layer 908. The nanowires 902, 904 may serve as the top and bottom electrodes 108, 102, respectively, in the resistive memory device 100. For example, when forming a resistive memory device similar to the example shown in FIG. 1, the nanowires in the top layer 906 could be formed from a conductive material, such as copper, aluminum, or the like, and the nanowires in the bottom layer 908 could be formed from the conductive material, which may be the same or different as the top layer 906. The upper nanowires would then serve as the top electrode 108 and the lower nanowires would serve as the bottom electrode 102.

To avoid complicating FIG. 9, the FE features 106 are not shown.

For purposes of illustration, only a few of the resistive memory devices 912-918 are shown in FIG. 9. Each of the combined devices 912-918 may be used to represent one or more bits of data. For example, in the simplest case, a resistive device may have two states: a conductive state and a nonconductive state. The conductive state may represent a binary "1" and the nonconductive state may represent a binary "0", or vice versa. Binary data may be written into the nanowire memory array 900 by changing the conductive state of the matrix within the resistive memory devices. The binary data can then be retrieved by sensing the conductive state of the resistive memory devices 912-918.

The example above is only one illustrative example of the nanowire memory array 900. A variety of other configurations may be used. For example, the memory array 900 may incorporate nonlinear elements that have different structures. The different structures could include more or less layers, layers that have different compositions than described above, and layers that are ordered in different ways than shown in the example given above. For example, the memory array may include memristors or other memory elements. Further, the memory array may use a wide range of conductors to form the crossbars.

It should be understood that the resistive memory devices, and memristors, described herein, such as the example memristors depicted in the Figures, may include additional components and that some of the components described herein may be removed and/or modified without departing from the scope of the resistive memory device disclosed herein. It should also be understood that the components depicted in the Figures are not drawn to scale and thus, the components may have different relative sizes with respect to each other than as shown therein. For example, the upper, or second, electrode 114 may be arranged substantially perpendicularly to the lower, or first, electrode 106 or may be arranged at some other non-zero angle with respect to each other. Further, deposited layers may or may not be conformal with respect to underlying features.

What is claimed is:

1. A resistive memory device including:
   a bottom electrode and a top electrode;
   a field enhancement (FE) feature that extends from the bottom electrode toward the top electrode, the FE feature to effect an electric field generated by the two electrodes to thereby confine a switching area of the device at the FE feature;
   a planar interlayer dielectric surrounding the FE feature and supporting the top electrode; and
   a switching layer extending between the top electrode and the FE feature on the bottom electrode;
   wherein the switching layer covers the FE feature with portions of the interlayer dielectric extending between the switching layer and the top electrode on either side of the FE feature.

2. The resistive memory device of claim 1, comprising a memristive device.

3. The resistive memory device of claim 1, wherein the switching layer comprises a transition metal oxide selected from the group consisting of tantalum oxide, titanium oxide, yttrium oxide, hafnium oxide, niobium oxide, and zirconium oxide, or a non-transition metal oxide selected from the group consisting of aluminum oxide, calcium oxide, magnesium oxide, dysprosium oxide, lanthanum oxide, and silicon dioxide, or a transition metal nitride selected from the group consisting of tantalum nitride and titanium nitride.

4. The resistive memory device of claim 1, wherein the two electrodes are independently selected from the group consisting of aluminum, copper, platinum, tungsten, gold, titanium, silver, ruthenium dioxide, titanium nitride, tungsten nitride, tantalum, and tantalum nitride.

5. The resistive memory device of claim 1, further including a diffusion barrier over the bottom electrode, the switching layer being disposed over the diffusion barrier, a non-linear select element between the switching layer and the top electrode.

6. The resistive memory device of claim 5, wherein the interlayer dielectric isolates one device from a neighboring device, the interlayer dielectric comprising a polymeric material.

7. The resistive memory device of claim 1, wherein the FE feature is formed of a material selected from the group consisting of an oxide, silicon, polysilicon, a nitride and a metal.

8. The resistive memory device of claim 1, wherein the FE feature has a shape selected from the group consisting of:
- a shape defined by a base disposed on the bottom electrode and a cross-section that tapers to a point above the bottom electrode; and
- a shape defined by a pore of a polymer layer that is removed after the FE feature is formed on the bottom electrode.

9. The resistive memory device of claim 1, wherein the FE feature effects the electric field between the two electrodes such that a lower voltage will be sufficient to change a resistance state of the switching layer than if the FE feature were not present.

10. The resistive memory device of claim 1, wherein the FE feature comprises multiple features on the bottom electrode extending toward the top electrode.

* * * * *